United States Patent [19]
Kass et al.

[11] Patent Number: 5,216,635
[45] Date of Patent: Jun. 1, 1993

[54] SYSTEM AND METHOD FOR REQUESTING ACCESS TO A COMPUTER MEMORY FOR REFRESHING

[75] Inventors: William J. Kass, Easley; Michael R. Hilley, Belton, both of S.C.

[73] Assignee: NCR Corporation, Dayton, Ohio

[21] Appl. No.: 735,136

[22] Filed: Jul. 24, 1991

[51] Int. Cl.⁵ .............................................. G11C 7/00
[52] U.S. Cl. ................................... 365/222; 365/233; 364/246.9
[58] Field of Search ............................. 365/222, 233; 364/246.91, 964.9, 941.2, 246.2

[56] References Cited

U.S. PATENT DOCUMENTS

| | | | |
|---|---|---|---|
| 4,535,330 | 8/1985 | Carey | 364/900 |
| 4,635,224 | 1/1987 | Müller | 365/222 |
| 4,796,232 | 1/1989 | House | 365/222 |
| 4,807,196 | 2/1989 | Mizukami | 365/222 |
| 4,849,936 | 7/1989 | Mizutani | 365/222 |
| 4,924,381 | 5/1990 | Tokuume | 365/222 |
| 4,937,781 | 6/1990 | Lee | 364/900 |
| 4,965,722 | 10/1990 | Tokuume | 364/200 |
| 4,999,814 | 3/1991 | Hashimoto | 365/222 |
| 5,033,027 | 7/1991 | Amin | 365/222 |

*Primary Examiner*—Eugene R. LaRoche
*Assistant Examiner*—A. Zarabian
*Attorney, Agent, or Firm*—Douglas S. Foote; Paul J. Maginot

[57] ABSTRACT

A system and method for requesting access to refresh a computer memory. Two lines are connected between a timer and arbiter. A memory refresh request signal is provided on the first line and is accorded a relatively low priority by the arbiter. If the first request is not granted within a predetermined period of time, a second memory refresh request signal is provided on the second line and is accorded a relatively high priority by the arbiter.

8 Claims, 2 Drawing Sheets

SYSTEM AND METHOD FOR REQUESTING ACCESS TO A COMPUTER MEMORY FOR REFRESHING

The present invention relates to computer memory systems. More particularly, it relates to the handling of requests to access the memory for refresh operations.

BACKGROUND OF THE INVENTION

Most computer systems utilize a "volatile" memory which stores instructions and data for use by one or more processors. A typical volatile memory is a dynamic random access memory (DRAM) in which individual data bits are stored in a semiconductor capacitor. The capacitor is charged for a "one" and left uncharged for a "zero." The DRAM is volatile because the stored charge decays fairly rapidly. To maintain the integrity of such data, it must be periodically renewed or "refreshed". This is accomplished by reading the data before it completely decays and rewriting the data by recharging any capacitor storing a "one." DRAM is typically refreshed 500 times each second.

A characteristic of computer systems is that there is frequently competing demands for access to the memory. For example, each processor in the system may need to read or write data to the memory. In addition, the memory must be periodically accessed to be refreshed. A characteristic of memory is that it can not be accessed simultaneously. Thus, some mechanism must be provided to regulate access when simultaneous accesses are demanded.

Many computer systems have a memory controller to provide such regulation. One of the controller's duties is to arbitrate among competing requests for memory access. Because a system cannot tolerate data loss, refresh requests are usually given a fairly high priority thereby allowing prompt access. At least one known system even provides a lockout feature by which other requests for memory access are blocked until the refresh request is granted.

A disadvantage of known systems is that many requests for read and write operations from system processor(s) are delayed so that refreshing can take place. Such delays make a computer system less efficient.

OBJECTS OF THE INVENTION

It is therefore an object of the present invention to provide a new and improved system and method for requesting access to a computer memory for refreshing.

It is another object of the present invention to provide a system and method for improving the efficiency of a computer system.

It is a further object of the present invention to provide a system and method for more efficiently handling memory refreshing.

It is yet another object of the present invention to provide a new and improved arbitration scheme for a computer system.

SUMMARY OF THE INVENTION

One form of the present invention is a system for requesting access to a computer memory including two lines connected between a timer and arbiter. The lines provide memory refresh request signals and are accorded different priorities by the arbiter.

Another form of the present invention is a method for requesting access to refresh a computer memory by making a first request followed by a higher priority request if the first request is not granted.

DESCRIPTION OF A PREFERRED EMBODIMENT

Figure 1:
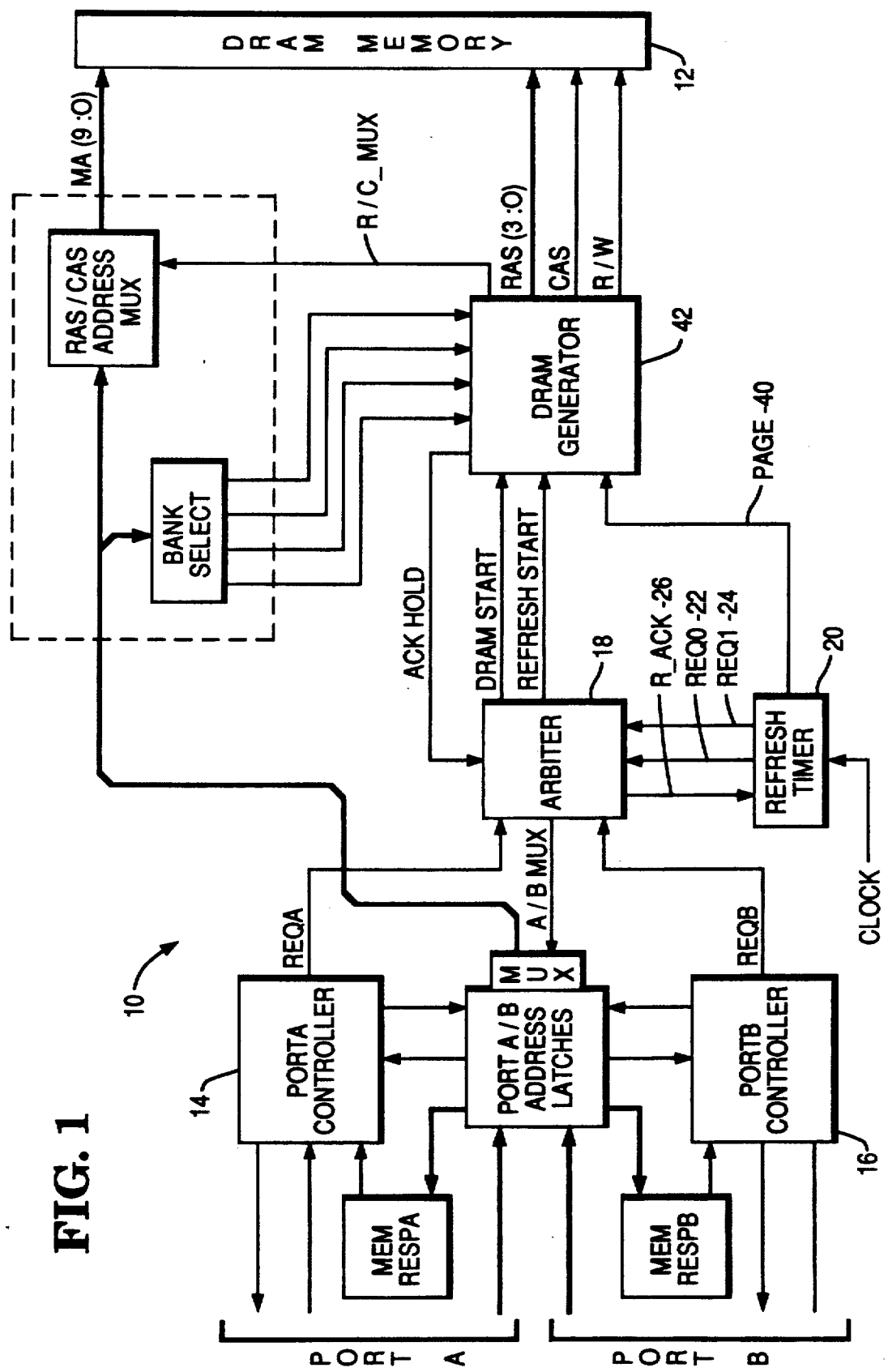
FIG. 1 is a block diagram of a computer memory control system.

FIG. 1 shows a computer memory control system 10. System 10 includes a system memory or DRAM 12 which is accessible through two ports (PORT A and PORT B). Each port has an associated controller 14 and 16, respectively. Each controller 14 and 16 provides a memory request signal REQA and REQB, respectively, to an arbiter 18. Request signals REQA and REQb are asserted for either a read or write operation to memory 12.

System 10 also includes a timing circuit or refresh timer 20. Lines 22, 24 and 26 connect timer 20 and arbiter 18. Lines 22 and 24 provide refresh request signals REQ0 and REQ1, respectively, from timer 20 to arbiter 18. Line 26 provides a refresh acknowledge signal RACK from arbiter 18 to timer 20. Line 40 connects timer 20 and DRAM generator 42 and transfers a PAGE signal from timer 20 to generator 42.

Figure 2:
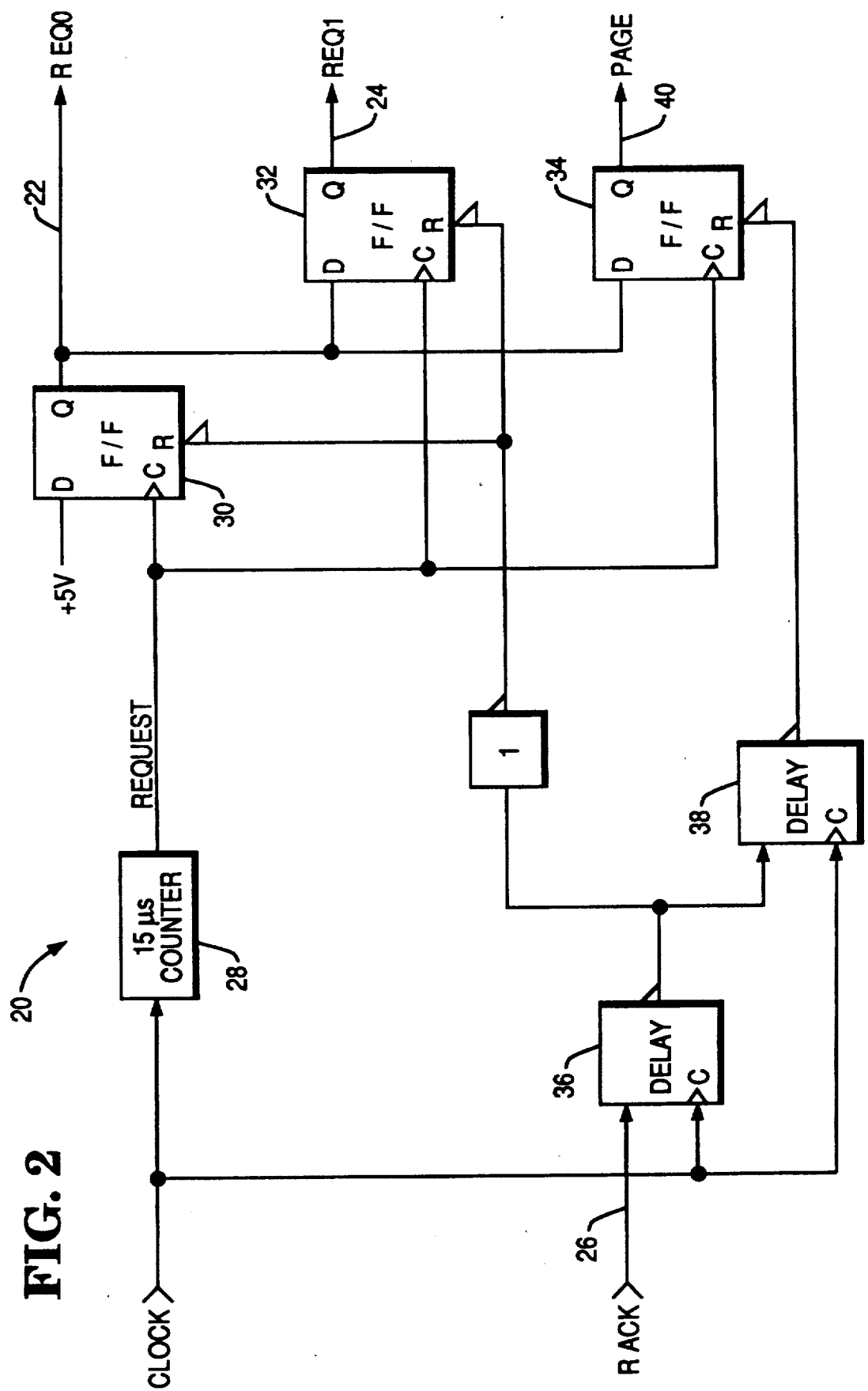
FIG. 2 is a circuit diagram of the refresh timer shown in FIG. 1.

FIG. 2 shows a circuit diagram of timer 20. Timer 20 includes a counter 28, flip-flops 30, 32 and 34, and delay elements 36 and 38. Counter 28 receives a clock signal CLOCK and provides a periodic output signal REQUEST (every 15 microseconds). Each flip-flop 30, 32 and 34 is provided with a data input D, a data output Q, a clock input C and a reset input R. Clock inputs C of flip-flops 30, 32 and 34 are connected to the output of counter 28 for receiving the REQUEST signal. The data input of flip-flop 30 is connected to a +5 v reference voltage source. The data inputs D of flip-flops 32 and 34 are connected to the Q output of flip-flop 30. The Q outputs of flip-flops 30, 32 and 34 are connected to lines 22, 24 and 40, respectively. The reset inputs R of flip-flops 30, 32 and 34 are connected to line 26. Delay element 36 is connected between line 26 and the reset inputs R of flip-flops 30 and 32. Delay elements 36 and 38 are serially connected between line 26 and the reset input of flip-flop 34.

From highest to lowest, the order of priority ascribed to the different request signals by arbiter 18 is as follows:

REQ1
REQA
REQB
REQ0

In operation, arbiter 18 arbitrates between the bus request and memory refresh requests and grants access to memory 12 according to the preceding order.

Counter 28 provides a REQUEST signal every 15 micro seconds. This sets flip-flop 30 which activates the REQ0 signal. There are now two possibilities depending upon whether arbiter 18 has competing requests.

Assume arbiter 18 has no competing requests. The REQ0 request is granted and the RACK signal is activated. The RACK signal is received by timer 20 but is delayed by delay element 36 before resetting flip-flop 30. The amount of delay introduced corresponds to the amount of time required to refresh memory 12. In a preferred embodiment, only one row of DRAM 12 is refreshed for each REQ0 signal which is acknowledged.

In contrast, assume arbiter 18 has competing requests, such as REQA, when REQ0 is received. REQ0 will not be granted and RACK will not be activated. Counter 28 continues to count clock pulses and provides a second REQUEST signal 15 micro seconds later. Since REQ0 is maintained (Q output high) until granted by the RACK signal, flip-flops 32 and 34 are set thereby activating the REQ1 and PAGE signals. Since REQ1 has the highest priority, it must be granted by arbiter 18. The RACK signal is activated and which resets flip-flops 30 and 32 as described above. However, delay element 38 provides additional delay before resetting flip-flop 34 and deactivating the PAGE signal.

The PAGE signal is interpreted by DRAM generator 42 as a request for refreshing two rows of memory in contrast to a single row when REQ0 is granted. This allows the system to have the same amount of memory refreshed as if back-to-back REQ0 signals had been granted.

As can be seen, the entire memory 12 will be refreshed in the same time as if a single high priority refresh signal were employed. However, the dual refresh signals (REQ0 and REQ1) allow port A or port B memory accesses to continue, if needed, for the 15 micro seconds between the first and second refresh request. This time is sufficient to provide a significant increase in performance of a computer system.

It will be clear to those skilled in the art that the present invention is not limited to the specific embodiment disclosed and illustrated herein. For example, other memory request signals may be received by arbiter 18 and the order of the non-refresh request signals may be varied.

Numerous modifications, variations, and full and partial equivalents can be undertaken without departing from the invention as limited only by the spirit and scope of the appended claims.

What is desired to be secured by Letters Patent of the United States is as follows.

What is claimed is:

1. A system for requesting access to a computer memory for refreshing comprising:
   a timing circuit;
   an arbiter; and
   first and second lines connecting said circuit and arbiter for transferring first and second refresh request signals, respectively, from said circuit to said arbiter,
   said circuit includes
      a counter which receives a clock signal and periodically generates a request signal, and
      first and second flip-flops, each having a data input and output and a clock input;
      wherein the clock input of said first and second flip-flops are connected to said counter for receiving said request signal;
      wherein the data input of said first flip-flop is connected to a reference voltage source; and
      wherein the data input of said second flip-flop is connected to the output of said first flip-flop;
      wherein the output of said first flip-flop is connected to said first request line and the output of said second flip-flop is connected to said second request line.

2. The system of claim 1 wherein each of said flip-flops has a reset input connected to said third line.

3. The system of claim 2 wherein said circuit further includes:
   a delay element connected between said third line and the reset input of said flip-flops.

4. The system of claim 1 wherein said circuit further comprises:
   a third flip-flop having a data input and output and a clock input;
   wherein the clock input of said third flip-flop is connected to said counter for receiving said request signal;
   wherein the data input of said third flip-flop is connected to the output of said first flip-flop; and
   wherein the output of said third flip-flop provides a signal indicating multiple refresh operations are requested.

5. The system of claim 4 wherein each of said flip-flops has a reset input connected to said third line.

6. The system of claim 5 wherein said circuit further includes:
   first and second delay elements, said first element connected between said third line and the reset input of said first and second flip-flops, and said first and second elements serially connected between said third line and the reset input of said third flip-flop.

7. A system for requesting access to a computer memory for refreshing comprising:
   a timing circuit;
   an arbiter;
   first and second lines connecting said circuit and arbiter for transferring first and second refresh request signals, respectively, from said circuit to said arbiter;
   a third line connecting said circuit and arbiter for transmitting an acknowledge signal from said arbiter to said circuit; and
   additional lines connected to said arbiter for transferring other memory access request signals to said arbiter;
   wherein said arbiter arbitrates between said refresh and other memory access request signals; and
   wherein said arbiter ascribes the highest priority to said second refresh request signal;
   said circuit includes
      a counter which receives a clock signal and periodically generates a request signal;
      first and second flip-flops, each having a data input, data output, clock input and reset input; and
      a first delay element connected between said third line and the reset input of said flip-flops;
      wherein the clock input of said first and second flip-flops are connected to said counter for receiving said request signal;
      wherein the data input of said first flip-flop is connected to a reference voltage source;
      wherein the data input of said second flip-flop is connected to the output of said first flip-flop; and
      wherein the output of said first flip-flop is connected to said first request line and the output of said second flip-flop is connected to said second request line.

8. The system of claim 7 wherein said circuit further comprises:
   a third flip-flop having a data input, data output, clock input and reset input; and
   a second delay element;

wherein said first and second delay elements are serially connected between said third line and the reset input of said third flip-flop;
wherein the clock input of said third flip-flop is connected to said counter for receiving said request signal;
wherein the data input of said third flip-flop is connected to the output of said first flip-flop; and
wherein the output of said third flip-flop provides a signal indicating multiple refresh operations are requested.

* * * * *